United States Patent [19]

Klinedinst

[11] Patent Number: 5,118,529
[45] Date of Patent: Jun. 2, 1992

[54] PROCESS FOR COATING FINELY DIVIDED MATERIAL WITH TITANIA

[75] Inventor: Keith A. Klinedinst, Marlboro, Mass.

[73] Assignee: GTE Laboratories Incorporated, Waltham, Mass.

[21] Appl. No.: 539,761

[22] Filed: Jun. 18, 1990

[51] Int. Cl.⁵ .............................................. B05D 7/00
[52] U.S. Cl. ................................... 427/213; 427/215; 427/216; 427/255.1; 427/255.3; 427/314; 427/318; 427/327
[58] Field of Search ............... 427/213, 215, 67, 216, 427/255.1, 255.3, 314, 318, 327

[56] References Cited

PUBLICATIONS

P. Sviszt "Investigation of the Photochemical Behaviour of ZnS Single Crystals", Phys. Stat.sol. 4, 631 (1964) p. 631–638.
P. E. Simmonds, L. Eaves, "Study of ultraviolet light--induced aging of ZnS phosphor powder by Two--beam photoacoustic spectroscopy" Appl. Phys. Lett. 39 (1981), p. 558–560.
J. Weiszburg, "Optical measurements and the darkening effect of ZnS fluorescent materials", J. Appl. Phys. 17 (1966) p. 693–694.

Primary Examiner—Bernard Pianalto
Attorney, Agent, or Firm—Carl F. Ruoff

[57] ABSTRACT

A method for coating finely divided material with titania is disclosed. The method involves the fluidization of the finely divided material in an inert carrier gas containing vaporized titanium isopropoxide. The isothermal fluidized bed is kept at a temperature equal to or below approximately 300° C. The vaporized titanium isopropoxide reacts to form a coating of titania on the surfaces of the particles within the fluidized bed. The greatest coating efficiency occurs when the fluidized bed is kept at approximately 300° C. for approximately the first 10 minutes of the reaction and thereafter at approximated 250° C. The titania coating process is particularly useful for electroluminescent phosphors such as copper doped zinc sulfide phosphor. The titania coated electroluminescent phosphors are relatively insensitive to moisture. Lamps made from the coated electroluminescent phosphor are also relatively insensitive to moisture.

7 Claims, 7 Drawing Sheets

PROCESS FOR COATING FINELY DIVIDED MATERIAL WITH TITANIA

BACKGROUND OF THE INVENTION

Titania (titanium dioxide, TiO$_2$) is a material characterized by many interesting and useful chemical and physical properties. Because of this, titania and titania-coated surfaces are employed in a wide range of commercial and industrial applications including the catalysis and photo-catalysis of chemical reactions, pigmentation, the filtering or reflection of electromagnetic radiation, modification of the electrical properties of surfaces, chemical resistance and absorbency, and so forth. Vast quantities of pure titania and of titania-coated materials are employed around the world in such applications. The great commercial importance of titania and titania-modified materials provides the motivation behind research and development efforts directed towards new and improved techniques for the creation and processing of such materials.

In addition, zinc sulfide-based phosphors (typically doped with copper) may be stimulated to emit visible light either by the absorption of ultraviolet radiation (as in a fluorescent lamp) or by the use of electrical energy in a so-called electroluminescent lamp, where a layer of the phosphor is sandwiched between a front transparent electrode and a back non-transparent electrode, with a layer of insulating material (typically barium titanate) sandwiched between the phosphor layer and the back electrode. In both cases, however, the luminescent efficiency of the phosphor degrades much more rapidly if the phosphor is exposed to a moisture-containing atmosphere than if it is exposed only to a very dry atmosphere (while being stimulated by ultraviolet radiation or by the application of an alternating electromagnetic field). The formation of a thin continuous and conformal coating of titania on the surfaces of zinc sulfide phosphor particles protects the particles from the effects of atmospheric moisture.

Continuous and conformal titania films may be formed by a variety of processes including the oxidation of evaporated titanium films, the reactive sputtering of titanium in an oxygen-containing atmosphere, the anodic oxidation of a titanium surface, and by the oxidation of a gaseous titanium compound such as titanium tetrachloride or titanium isopropoxide (Ti[(CH$_3$)$_2$CHO]$_4$). The gas-phase oxidation of a titanium compound to form a titanium oxide film is an example of chemical vapor deposition (CVD). Such reactive CVD processes with inorganic or organometallic titanium precursors typically require relatively high temperatures (in the vicinity of 400° C. or above) and they typically require a source of gaseous oxygen, in addition to the gaseous titanium-containing precursor.

The requirements for both relatively high reaction temperatures and oxidizing atmospheres preclude the use of such CVD techniques to form titania coatings upon the surfaces of materials which cannot withstand being heated to such temperatures in an oxidizing atmosphere. This constraint is particularly significant if titania coatings are to be formed upon the surfaces of reactive finely divided materials since, in this case, the high surface-to-volume ratio may render the material extremely vulnerable to attack under such conditions. On the other hand, oxide coatings cannot be formed efficiently upon the surfaces of particles of a finely divided material by other than a CVD technique with the powdered material suspended in a gas-fluidized bed.

The disadvantages of the existing methods for the formation of titanium oxide coatings upon the surfaces of finely divided materials are completely eliminated by the method described in this disclosure. Specifically, the disclosed invention provides a method for the formation of continuous and conformal titania coatings of any desired thickness upon the surfaces of finely divided materials without exposing the powdered material to an oxidizing atmosphere and without exposing the material to temperatures in excess of 300° C.

SUMMARY OF THE INVENTION

A method for forming a continuous layer of titania on particles of a finely divided material is described which includes the following steps. Titanium isopropoxide is vaporized into an inert carrier gas and the resultant gas mixture is passed into a fluidized bed containing the finely divided material. The temperature of the isothermal fluidized bed is equal to or less than about 300° C. The vaporized titanium isopropoxide reacts to form a coating of titania on the outer surfaces of the particles of the finely divided material. The most efficient titania coating occurs when the fluidized bed is heated to approximately 300° C. for the first 10 minutes of the coating reaction and then lowering the temperature of the fluidized bed to approximately 250° C. for the remainder of the coating operation. The thickness of the titania coating is directly related to the length of the coating reaction.

In one aspect of the present invention, copper doped zinc sulfide electroluminescent phosphors were coated with titania by the reaction described. The resultant phosphor was more resistant to water vapor while having an initial brightness equivalent to that of the uncoated phosphor. Electroluminescent lamps manufactured using this phosphor were also insensitive to water vapor.

DETAILED DESCRIPTION OF THE PREFERRED EMBODIMENTS

Figure 1:
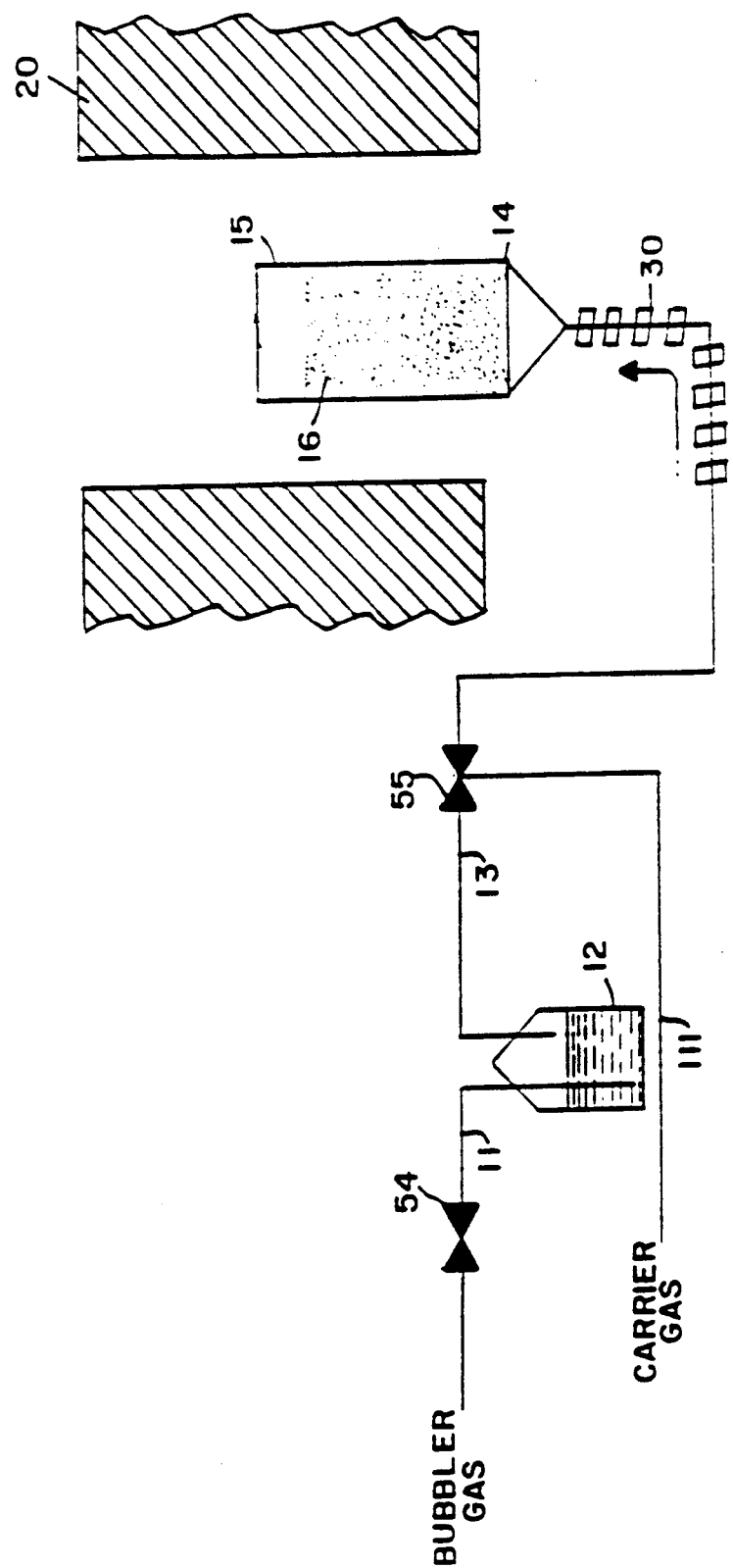
FIG. 1 shows the apparatus used to carry out the method of the present invention.

FIG. 1 shows the apparatus used to implement the method of the present invention. The finely divided material 16 is suspended in a gas-fluidized bed 15 using an inert carrier gas such as nitrogen or argon. Titanium isopropoxide ($Ti[(CH_3)_2CHO]_4$) is used as the organometallic coating precursor. Prior to entering the fluidized bed 15 through distributor 14 part or all of the inert carrier gas is passed through the bubbler 12 through line 11. The remaining carrier gas is passed through line 111 to the fluidized bed. Valves 54 and 55 are used to control the flow rates of the inert gas passed through the bubbler and the inert gas which bypasses the bubbler. The bubbler 12 is filled with liquid titanium isopropoxide (TIP) heated by heating tape or other means (not shown) to a temperature high enough to produce a TIP equilibrium vapor pressure sufficient to yield a desired coating rate. The bubbler temperature is typically between 100° C. and 140° C. The portion of the fluidizing gas line located between the bubbler outlet and the fluidized bed inlet is heated to a temperature a few degrees above the bubbler temperature by heating tape 30 in order to prevent condensation of the TIP within the gas lines.

The fluidized bed itself is heated to a temperature of approximately 300° C. or less by means of an external furnace 20. Thermocouples (not shown) positioned at various heights within the fluidized powder bed 15 are used to verify that an essentially isothermal condition exists within the bed during the coating process. An agitator (not shown) can be used to aid in the fluidization of the particles. The highest coating efficiencies are obtained with fluidized bed temperatures between 250° C. and 300° C. Optimal coating efficiencies are obtained if the first few minutes of the coating process are carried out with a fluidized bed temperature in the vicinity of 300° C., with the remainder of the coating process proceeding at a temperature in the vicinity of 250° C. The titania coatings formed under these conditions are both continuous and conformal. The coating thickness increases linearly with coating time.

The key elements of this new coating process are further described by means of the following series of examples. In each case, the TIP bubbler temperature was 120° C., the fluidized bed diameter was 3.5 cm, the fluidizing gas (bubbler gas and carrier gas) was pure nitrogen, and the fluidizing gas flow rate was 0.75 l/min. Two-thirds of the fluidizing gas passed through the TIP bubbler on its way to the inlet of the fluidized powder bed, one third of the fluidizing gas bypassed the bubbler through line 111 and valve 55.

EXAMPLE 1

Four 300 gram quantities of a finely divided calcium halophosphate material (mean particle size about 25 microns) were processed in the fluidized bed, each for a period of three hours. The fluidized bed temperature versus time profiles and the w/o titania contained with the resulting coated material (determined by chemical analyses performed after completion of the three-hour coating experiments) are listed in Table 1.

TABLE 1

| Run No. | Temp. vs Time Profile | w/o Titania |
|---|---|---|
| 1 | 3 hours at 300° C. | 3.05 |
| 2 | 10 min. at 300° C., followed by 170 min. at 250° C. | 3.41 |
| 3 | 10 min. at 300° C., followed by 170 min. at 200° C. | 0.23 |
| 4 | 3 hours at 250° C. | 1.02 |

As indicated in the table, substantial titania coatings are formed with fluidized bed temperatures between 250° C. and 300° C. In general, the higher the bed temperature, the more efficient the coating process. However, the highest coating efficiencies are obtained when the process is carried out in the vicinity of 300° C. for a short period of time, after which the bed temperature is lowered to a temperature in the vicinity of 250° C. and maintained there for the remainder of the process.

EXAMPLE 1

The titania-coated finely divided calcium halophosphate materials described in Example 1 were examined by high resolution scanning electron microscopy. Also examined was a sample of the uncoated halophosphate. Even at magnifications as high as 50,000×, no differences were detected in the scanning electron micrographs obtained with the uncoated and coated materials. Since two of the coated materials contained in excess of 3 w/o $TiO_2$, enough to form relatively thick coatings upon the surfaces of the halophosphate particles, it was concluded that the titania coatings are conformal. They conform to the contoured surface features of the underlying halophosphate particles.

EXAMPLE 3

The photoluminescent properties of the titania-coated finely divided calcium halophosphate materials (which were doped with manganese and antimony) described in Example 1 were also examined using a mercury arc lamp as a source of ultraviolet radiation. Titania is an excellent filter for ultraviolet light, the property responsible for its wide use as an ingredient of sun-screen products. Thus, the thicker the titania coating, the more the incident ultraviolet radiation will be absorbed before it reaches the interface between the coating and the halophosphate. Hence, the thicker the coating, the lower the intensity of the visible light emitted by the titania-coated halophosphate material. The intensity of the emitted visible light was measured in each case, and the resulting brightness data are listed in Table 2 (expressed as a percentage of the light emitted by a sample of the uncoated halophosphate material).

TABLE 2

| w/o Titania | Relative Brightness |
|---|---|
| 0.00 | 100.0% |
| 0.23 | 43.9% |
| 1.02 | 14.6% |
| 3.05 | 0.0% |
| 3.41 | 0.0% |

The visible light emitted by the halophosphate decreases approximately logarithmically with increasing w/o $TiO_2$ i.e., with increasing thickness of the titania coating. Further, all of the incident ultraviolet radiation is apparently absorbed by the titania coatings present in the materials containing at least 3 w/o $TiO_2$. These data demonstrate that the coatings are continuous i.e., that they cover the entire surface of the underlying finely divided material.

EXAMPLE 4

The titania-coated calcium halophosphate materials described in Example 1 were also examined via x-ray photoelectron spectroscopy. The relative atomic concentrations of titanium, oxygen, calcium, and phosphorus detected on or near the surface of each coated material are listed in Table 3. In each case, the data have been normalized by dividing by the quantities corresponding to the photoelectron detected from the surface oxygen. Also shown are the corresponding data obtained with a sample of the uncoated calcium halophosphate material.

TABLE 3

| w/o Titania | Relative Atomic Concentrations from XPS Analyses | | | |
|---|---|---|---|---|
| | Ti | O | Ca | P |
| 0.00 | 0.000 | 1.000 | 0.340 | 0.210 |
| 0.23 | 0.250 | 1.000 | 0.143 | 0.087 |
| 1.02 | 0.397 | 1.000 | 0.012 | 0.000 |
| 3.05 | 0.441 | 1.000 | 0.000 | 0.000 |
| 3.41 | 0.411 | 1.000 | 0.000 | 0.000 |

As shown in Table 3, the relative surface concentration of titanium increases and the surface concentrations of calcium and phosphorus decrease as the amount of titania applied to the surface of the finely divided material increases. Further, no calcium or phosphorus could be detected at or near to the surfaces of the materials containing at least 3 w/o $TiO_2$. Moreover, for these materials, the measured Ti:O atomic ratio is close to that expected for titanium dioxide. These data also demonstrate that the titania coatings are continuous i.e., that the cover the surfaces of the particles of finely divided material completely.

EXAMPLE 5

Five 350 gram quantities of a finely divided copper-doped zinc sulfide phosphor (mean particle size about 30 microns) were coated with titania in a fluidized bed reactor. In each case, the titania coating process was carried out for up to ten minutes at 300° C., the remainder of the processing being carried out with a 250° C. bed temperature. The temperature versus time profiles and the resulting titania concentrations are listed in Table 4.

TABLE 4

| ZnS:Cu Coating Conditions and Resulting w/o Titania | | | |
|---|---|---|---|
| Run No. | Temp. vs Time Profile | Process Time | w/o Titania |
| 5 | 7.5 min. at 300° C. | ¼ hr. | 0.17 |
| 6 | 10 min. at 300° C. then 5 min. at 250° C. | ¼ hr. | 0.26 |
| 7 | 10 min. at 300° C. then 20 min. at 250° C. | ½ hr. | 0.52 |
| 8 | 10 min. at 300° C. then 50 min. at 250° C. | 1 hr. | 0.90 |
| 9 | 10 min. at 300° C. then 110 min. at 250° | 2 hr. | 1.76 |

As shown in the table, the quantity of titania produced during the coating process increases linearly with coating time.

EXAMPLE 6

The materials described in Example 5 were all examined by x-ray photoelectron spectroscopy in order to determine their surface compositions. Also examined was a sample of the virgin (uncoated) ZnS:Cu phosphor. The measured XPS intensities were analyzed to yield the atomic percent data listed in Table 5. As indicated in Table 5, no sulfur or copper was detected in the materials containing more than 0.26 w/o $TiO_2$. Further, only a very small amount of zinc was detected in any of these materials. On the other hand, high concentrations of titanium and oxygen were detected in all of the coated materials. These data indicate that, for materials containing more than about 0.26 w/o $TiO_2$, the surfaces of the ZnS:Cu particles are coated with a virtually continuous layer of titanium dioxide.

TABLE 5

| XPS Surface Analysis Results for $TiO_2$-Coated ZnS:Cu (Atomic Percent) | | | | | |
|---|---|---|---|---|---|
| w/o $TiO_2$ | Zn2p | S2p | Cu2p | Ti2p | O1s |
| 0.00 | 25.0 | 24.2 | 0.3 | nd | 8.4 |
| 0.17 | 1.2 | 4.1 | nd | 21.8 | 56.2 |
| 0.26 | 0.4 | 0.2 | nd | 26.9 | 63.1 |
| 0.52 | 0.2 | nd | nd | 24.0 | 62.1 |
| 0.90 | 0.4 | nd | nd | 26.2 | 61.8 |
| 1.76 | 0.2 | nd | nd | 25.4 | 64.6 |

EXAMPLE 7

A pressed sample of the $TiO_2$-coated material described in Example 5 (Run #1) processed for ¼ hour (containing 0.26 w/o titania) and a pressed sample of the virgin (uncoated) phosphor were both exposed to a broadband source of ultraviolet radiation centered at about 365 nm. Both materials were exposed to room air of relatively high humidity throughout the test. Periodically, the brightnesses of the visible light emitted by the two samples were measured relative to that of a fresh sample of the virgin phosphor. The relative brightnesses of the two samples (expressed as a percentage of the brightness of a fresh sample of uncoated phosphor) are plotted as a function of time of exposure to the 365 nm UV source in FIG. 2.

Figure 2:
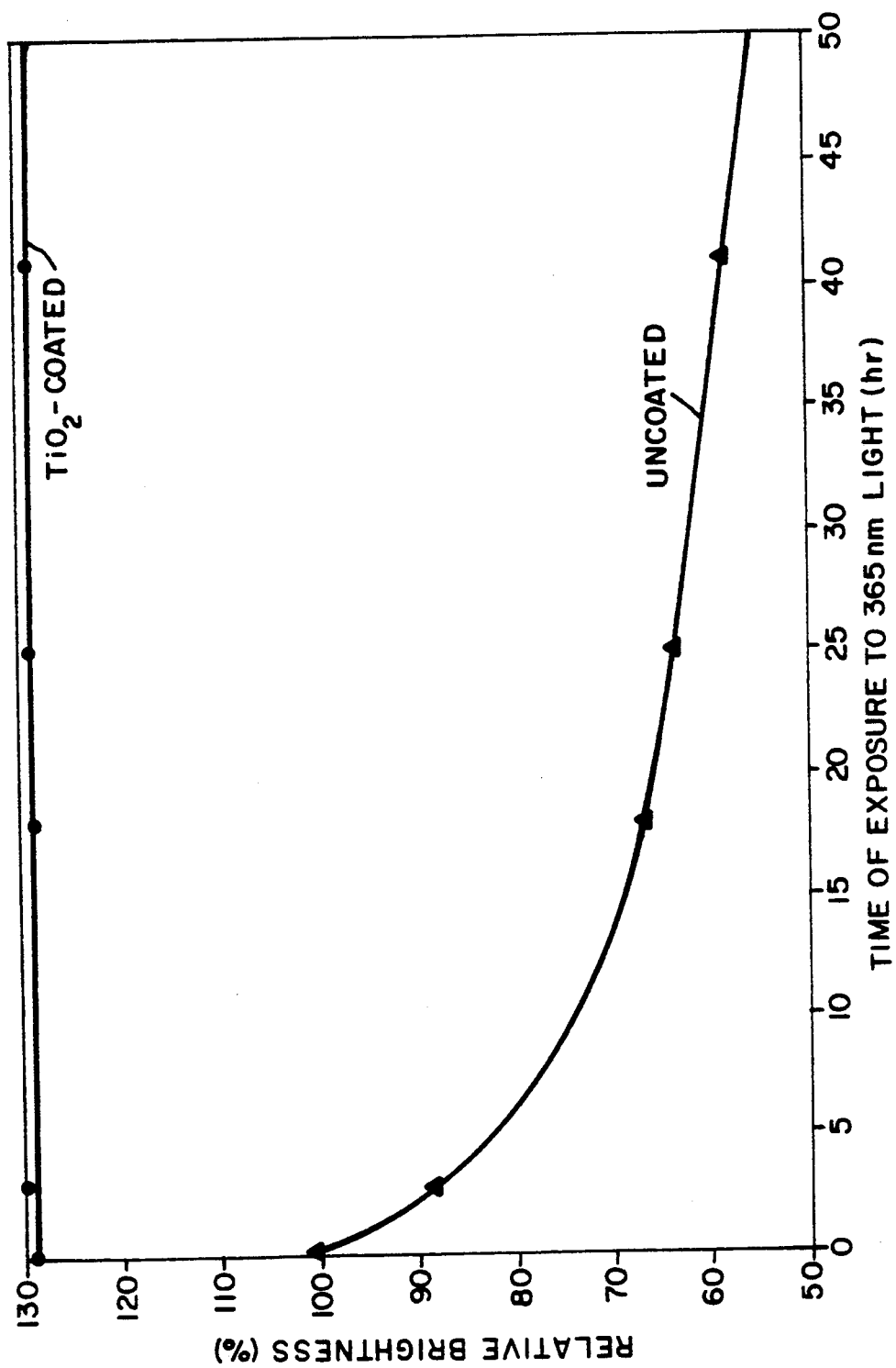
FIG. 2 shows the relative brightness of visible light emitted by titania coated and uncoated copper activated zinc sulfide phosphors under high relative humidity conditions.

As shown in FIG. 2, the brightness of the uncoated phosphor decreases rapidly with increasing time of exposure to ultraviolet light. This loss in brightness is also accompanied by a darkening of the material thought to be due to the deposition of finely-divided metallic zinc. In contrast, the brightness of the $TiO_2$-coated phosphor does not decrease with prolonged exposure to UV radiation. Further, the brightness of the coated phosphor is about 30% greater than that of the virgin phosphor. Similar results are obtained with all of the $TiO_2$-coated materials listed in Table 4. It is well known that the degradation of a ZnS-based phosphor by UV light is greatly accelerated by the presence of moisture in the atmosphere surrounding the phosphor. This example demonstrates that coating the phosphor with a thin layer of titanium oxide renders the material insensitive to the normally degrading effects of ultraviolet light, even if the irradiation of the phosphor occurs in a moisture-containing atmosphere.

EXAMPLE 8

The electroluminescent brightnesses of $TiO_2$-coated ZnS:Cu materials containing up to 0.5 w/o $TiO_2$ were determined using the standard castor oil cell methodology. Also examined was the virgin (uncoated) phosphor. The materials were excited with 60 Hz and 400 Hz a.c. sources with amplitudes of 150 V, 200 V, and 400 V. The oil cell brightnesses measured with the coated materials are listed in Table 6, expressed as percentages of the brightnesses measured with the uncoated phosphor.

TABLE 6

Oil Cell Brightness Data for TiO$_2$-Coated ZnS:Cu
(Percent of Uncoated Phosphor Brightness)

| w/o TiO$_2$ | 150 V | | 200 V | | 400 V | |
|---|---|---|---|---|---|---|
| | 60 Hz | 400 Hz | 60 Hz | 400 Hz | 60 Hz | 400 Hz |
| 0.17 | 126 | 120 | 108 | 108 | 90 | 92 |
| 0.26 | 114 | 108 | 100 | 101 | 85 | 88 |
| 0.34 | 118 | 136 | 91 | 118 | 64 | 79 |
| 0.52 | 107 | 119 | 80 | 104 | 80 | 63 |
| Avg. | 116 | 121 | 95 | 108 | 80 | 80 |

These data indicate that the electroluminescent brightnesses of the coated phosphors are comparable to those of the uncoated phosphor.

EXAMPLE 9

Figure 3:
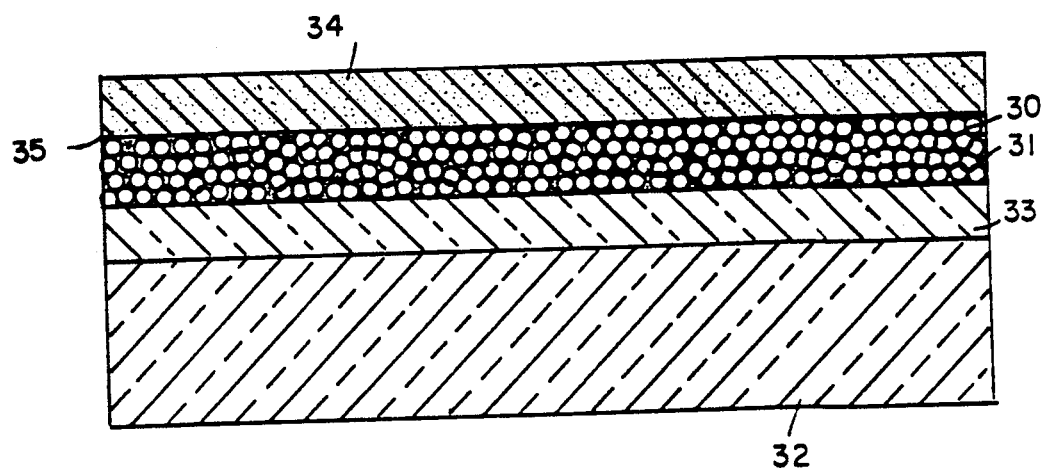
FIG. 3 shows a schematic of an electroluminescent lamp made from titania coated copper activated zinc sulfide phosphors.

Two sets of electroluminescent lamps were fabricated. In one set of lamps, the uncoated copper-doped zinc sulfide phosphor was employed as the luminescent material. The ZnS:Cu phosphor coated with titania using a ¼ hour process (Run #6) (described in Examples 5 and 6) was employed as the luminescent ingredient in the other set of lamps. As shown in FIG. 3, the phosphor particles 30 are dispersed in a polymeric organic binder 31, and were coated upon the surface of a transparent glass plate 32 that had first been coated with a thin, transparent electrode 33 composed of indium-tin oxide (ITO). A layer of insulating barium titanate 35, also dispersed in the polymeric organic binder, was subsequently formed on top of the phosphor layer. Finally, a layer of conductive carbon 34, to serve as the other lamp electrode, was formed upon the surface of the barium titanate layer. So as to apply an a.c. voltage source to each lamp, copper leads (not shown) were attached to the conductive carbon electrode layer and to the ITO electrode layer of each lamp. Unlike typical commercial electroluminescent lamps, these experimental lamps were not hermetically sealed within moisture-excluding plastic envelopes.

Lamps from both sets of phosphors were driven using a.c. power supplies which delivered 120 V at 400 Hz. The brightness of the visible light emitted by each lamp was measured as a function of time using a calibrated photodiode detector. Half of the lamps of each type were operated while exposed to dry air (less than 2% relative humidity). The other half of each set of lamps were operated while exposed to humid air (70%-80% relative humidity). Typical brightness versus time curves obtained with lamps containing the uncoated EL phosphor tested in both dry and humid environments are compared in FIG. 4. The corresponding data obtained with lamps containing the TiO$_2$-coated phosphor are similarly compared in FIG. 5.

Figure 4:
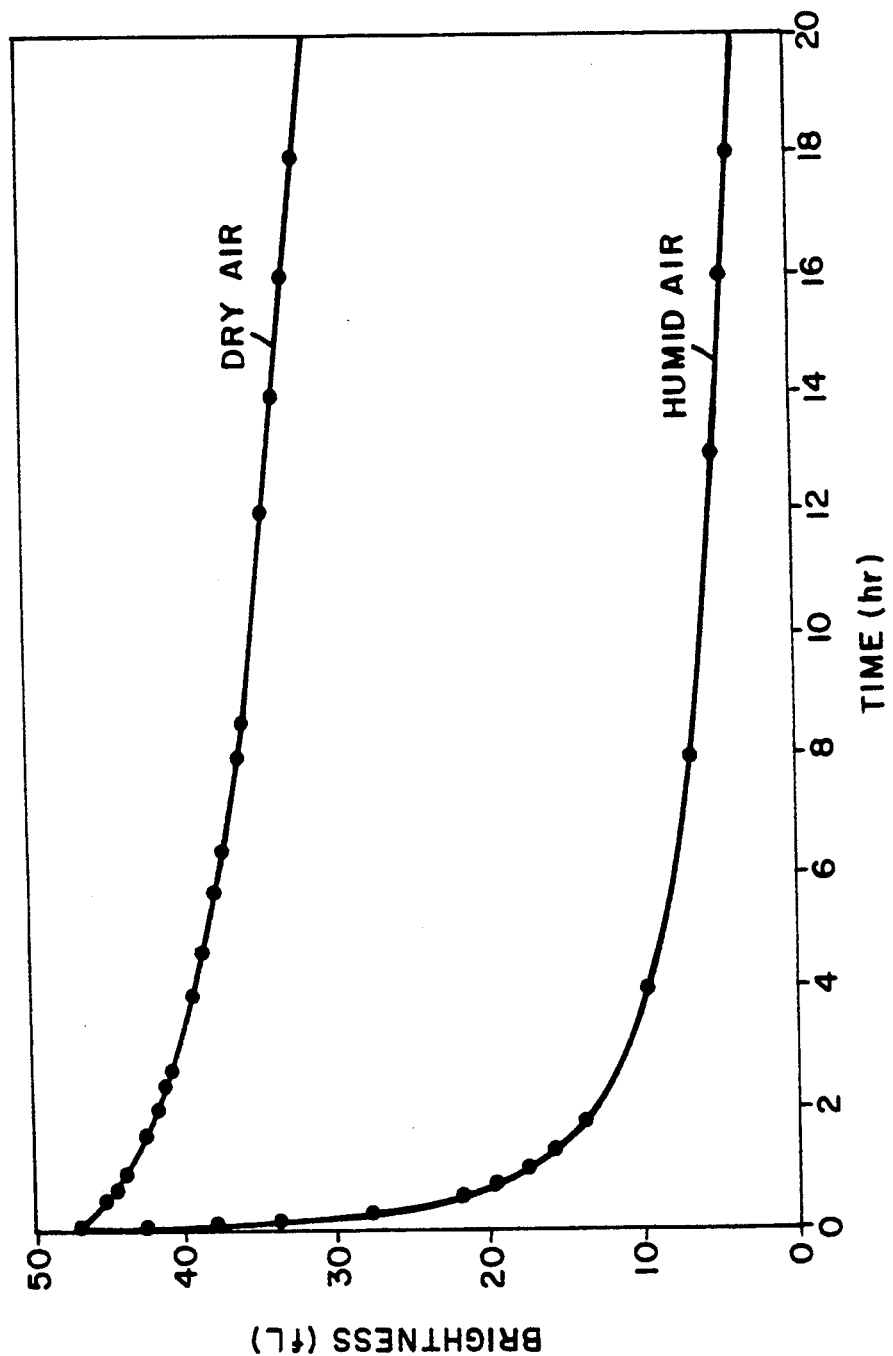
FIG. 4 shows brightness versus time profiles of unpackaged electroluminescent lamps containing uncoated copper activated zinc sulfide phosphor for dry and humid ambient conditions.
Figure 5:
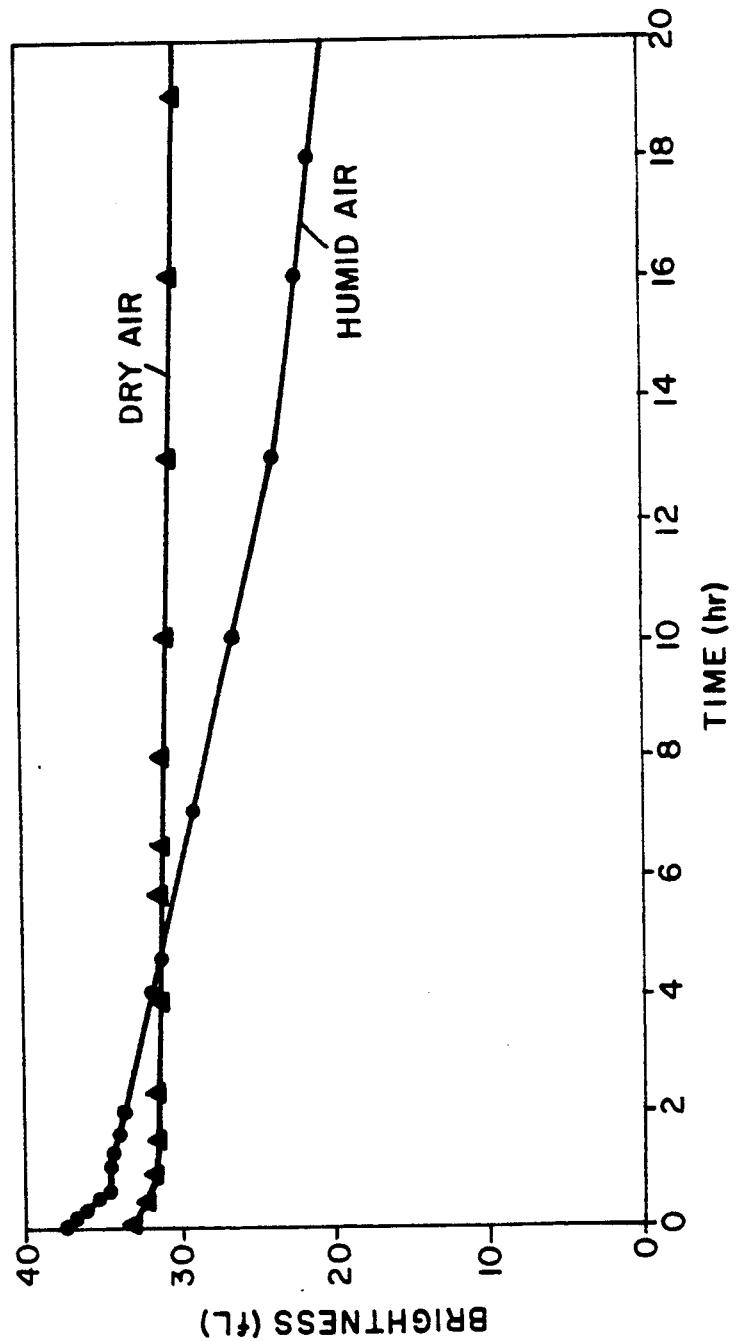
FIG. 5 shows brightness versus time profiles of unpackaged electroluminescent lamps containing titania coated copper activated zinc sulfide phosphor for dry and humid ambient conditions.

As shown in FIG. 4, the output of a lamp containing the uncoated phosphor deteriorates very rapidly when the lamp is operated in a humid atmosphere, a reflection of the extreme moisture sensitivity of the uncoated phosphor. By comparison, as shown in FIG. 5 the output of a lamp containing the TiO$_2$-coated phosphor is relatively insensitive to the moisture content of its environment, a reflection of the relative moisture insensitivity of the coated phosphor. The moisture insensitivity of the coated phosphor is clearly demonstrated by the fact that the slope of the brightness versus time curve obtained with a lamp containing the coated phosphor operated in a humid atmosphere (shown in FIG. 5) is very similar to that obtained with a lamp containing the uncoated phosphor operated in a very dry environment (shown in FIG. 4).

EXAMPLE 10

Electroluminescent lamps of the type described in Example 9 were operated in a humid environment (70%-80% supply. As before, some of the lamps contained the uncoated ZnS:Cu phosphor, while the others contained the titania-coated phosphor. Typical brightness versus time data obtained with lamps of each set during the first two hours of operation are compared in FIG. 6. The brightness versus time data obtained over a three day period with lamps containing the uncoated and TiO$_2$-coated phosphors are similarly compared in FIG. 7.

Figure 6:
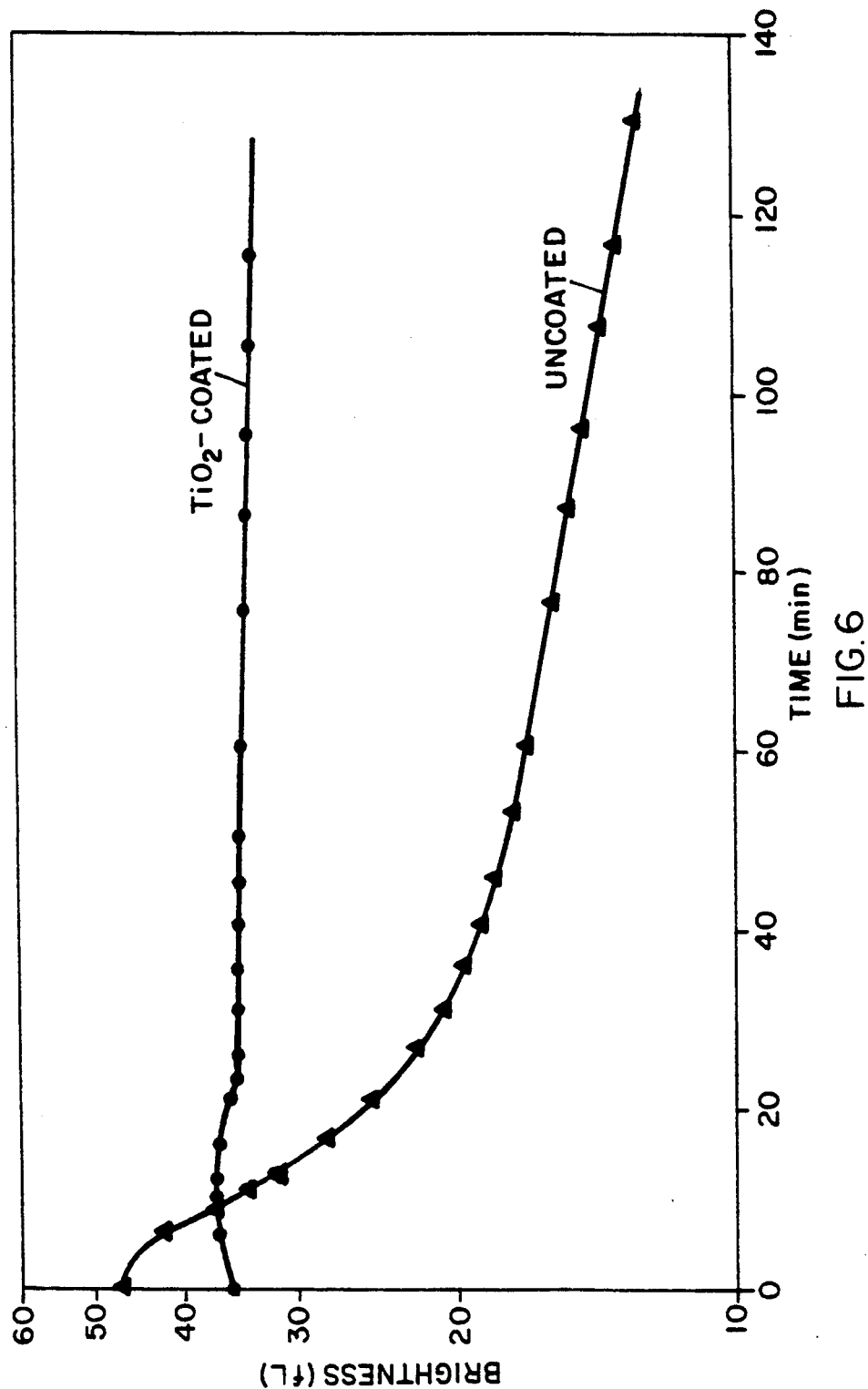
FIG. 6 shows brightness versus time profiles of unpackaged electroluminescent lamps containing titania coated and uncoated copper activated zinc sulfide phosphors in humid ambient conditions.
Figure 7:
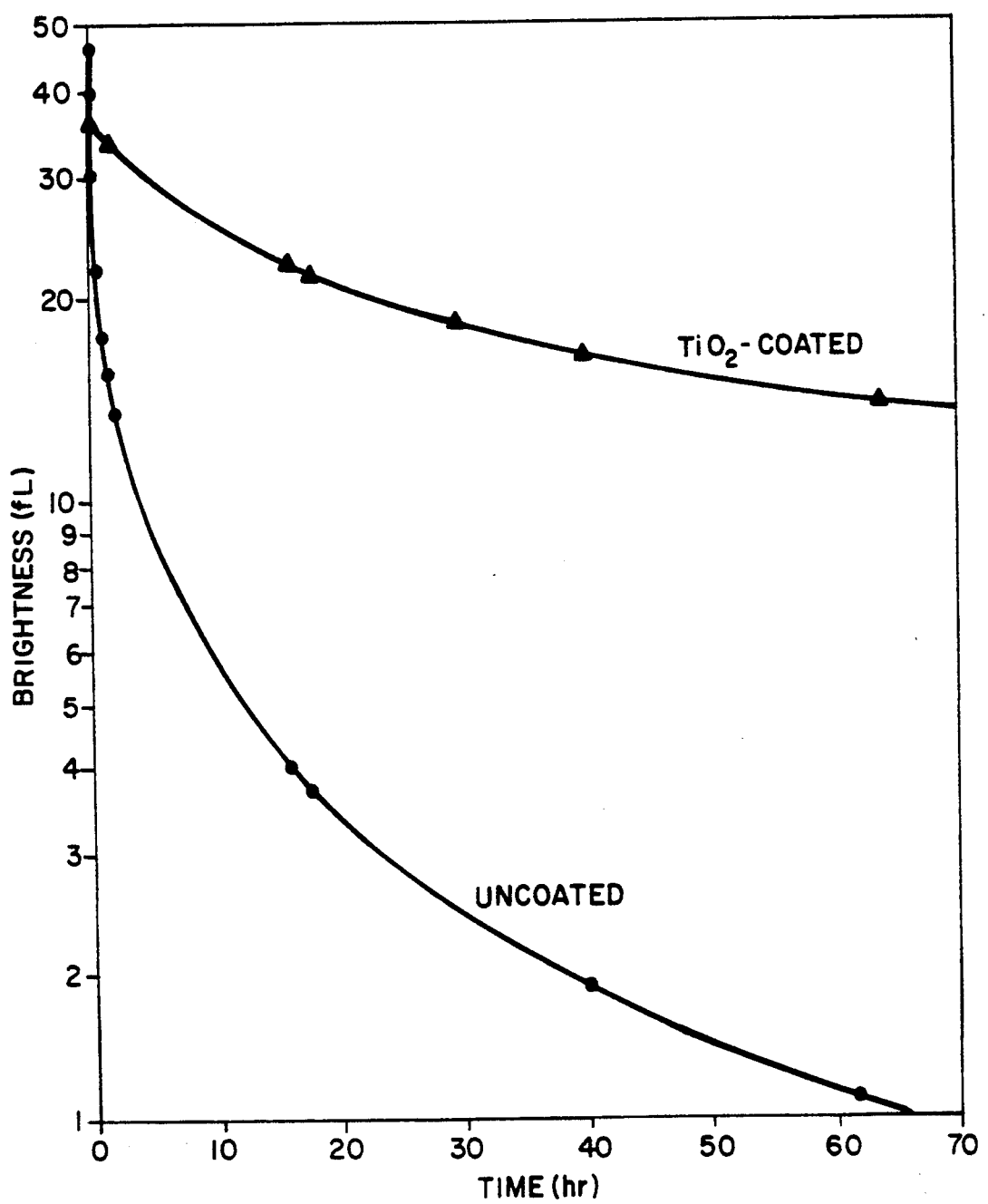
FIG. 7 shows brightness versus time profiles of unpackaged electroluminescent lamps containing titania coated and uncoated copper activated zinc sulfide phosphors in humid ambient conditions.

As shown in FIG. 6, whereas the brightness of a lamp containing the coated (moisture-resistant) phosphor is nearly constant during the first two hours of operation, the brightness of a lamp containing the uncoated (moisture-sensitive) phosphor decreases to roughly 30% of its initial value during the same two hour period. Further, as shown in FIG. 7, there is roughly an order of magnitude difference in brightness between the two sets of lamps after two days of constant operation. As in Example 9, these lamp performance data demonstrate the fact that compared with an uncoated ZnS:Cu phosphor, the titania-coated ZnS:Cu phosphors described in this disclosure are effectively insensitive to atmospheric moisture.

EXAMPLE 11

Unpackaged electroluminescent lamps of the type employed in Examples 9 and 10 were operated in a humid environment (70%-80% relative humidity), driven by a 120 V/400 Hz power supply. Some of the lamps contained an uncoated ZnS:Cu phosphor, while others contained the same phosphor coated with various amounts of TiO$_2$. In Table 7 phors, the w/o titania, the thickness of the titania coating (calculated from the known surface area of the phosphor, the density of TiO$_2$, and an assumed uniform coating thickness), and the ratio of the time to half brightness (the 'half-life') of the electroluminescent lamp containing that phosphor (expressed as a multiple of the half-life obtained with a lamp containing the uncoated phosphor).

TABLE 7

TiO$_2$ Coating Thickness vs Half-Life Data for Unpackaged EL Lamps

| w/o Titania | Thickness (Å) | $t_{\frac{1}{2}}$, coated/$t_{\frac{1}{2}}$, uncoated |
|---|---|---|
| 0.17 | 40 | 28 |
| 0.26 | 70 | 130 |
| 0.52 | 120 | 105 |
| 0.90 | 225 | 66 |

As indicated, the half-life of the electroluminescent lamp may be increased by over two orders of magnitude via the application of a TiO$_2$ coating to the surface of the ZnS:Cu phosphor. The optimal coating thickness appears to be in the 50 Å–100 Å range.

While there have been shown and discussed what are at present considered to be the preferred embodiments of the invention, it will be apparent to those skilled in the art that various changes, alterations and modifications can be made herein without departing from the scope of the invention defined by the appended claims.

What is claimed is:

1. A method for forming a continuous coating of titania on particles of a finely divided material comprising:
   a) vaporizing titanium isopropoxide in an inert carrier gas to form a carrier gas containing vaporized titanium isopropoxide;
   b) passing said carrier gas containing vaporized titanium isopropoxide through a finely divided material to form a fluidized bed in which particles are suspended in the carrier gas the to envelop the fluidized particles in said carrier gas containing said vaporized titanium isopropoxide said fluidized bed being maintained at a nearly isothermal condition and at a temperature of 300° C. or less;
   c) reacting the vaporized titanium isopropoxide on the particles of the finely divided material to form a continuous coating of titania of predetermined thickness on the particles.

2. The method according to claim 1 wherein said finely divided material comprises a copper doped zinc sulfide phosphor.

3. The method according to claim 1 wherein said fluidized bed is maintained at a temperature of approximately 300° C. for approximately the first ten minutes and thereafter maintained at approximately 250° C.

4. The method according to claim 1 wherein said finely divided material comprises calcium halophosphate.

5. A method for forming a continuous coating of titania on particles of a phosphor powder comprising:
   a) vaporizing titanium isopropoxide in an inert carrier gas to form a carrier gas containing vaporized titanium isopropoxide;
   b) passing said carrier gas containing vaporized titanium isopropoxide through particles of a phosphor powder to form a fluidized bed in which the particles of the phosphor powder are suspended in the carrier gas and to envelop the fluidized particles in the carrier gas containing titanium isopropoxide said fluidized bed being maintained at a nearly isothermal condition at a temperature of approximately 300° C. or less;
   c) reacting the vaporized titanium isopropoxide on the particles of the phosphor powder to from a coating of titania of predetermined thickness on the particles.

6. The method according to claim 5 wherein said fluidized bed is maintained at a temperature of approximately 300° C. for approximately the first ten minutes and thereafter maintained at approximately 250° C.

7. The method according to claim 5 wherein said phosphor comprises a copper doped zinc sulfide phosphor.

* * * * *